(12) United States Patent
Tang et al.

(10) Patent No.: US 11,121,185 B2
(45) Date of Patent: Sep. 14, 2021

(54) DISPLAY SUBSTRATE INCLUDING PIXEL UNIT GROUPS, DISPLAY DEVICE AND DISPLAY METHOD THEREOF, AND MASK PLATE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Fuqiang Tang, Beijing (CN); Yanyan Zhao, Beijing (CN); Zhiming Lin, Beijing (CN); Long Jin, Beijing (CN); Zhen Wang, Beijing (CN); Chun Chieh Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 373 days.

(21) Appl. No.: 16/300,642

(22) PCT Filed: Feb. 5, 2018

(86) PCT No.: PCT/CN2018/075264
§ 371 (c)(1),
(2) Date: Nov. 12, 2018

(87) PCT Pub. No.: WO2019/019604
PCT Pub. Date: Jan. 31, 2019

(65) Prior Publication Data
US 2020/0321407 A1    Oct. 8, 2020

(30) Foreign Application Priority Data

Jul. 25, 2017   (CN) .................. 201710612242.X

(51) Int. Cl.
*H01L 27/32* (2006.01)
*H01L 51/56* (2006.01)

(52) U.S. Cl.
CPC .......... *H01L 27/3218* (2013.01); *H01L 51/56* (2013.01)

(58) Field of Classification Search
None
See application file for complete search history.

(56) References Cited

U.S. PATENT DOCUMENTS

2013/0153748 A1   6/2013  Suzuki
2017/0040390 A1 * 2/2017  Sun ..................... H01L 27/3218
2020/0266246 A1 * 8/2020  Bok .................... H01L 51/5228

FOREIGN PATENT DOCUMENTS

CN    103167252 A    6/2013
CN    104134683 A    11/2014
(Continued)

OTHER PUBLICATIONS

The International Search Report and Written Opinion dated May 10, 2018; PCT/CN2018/075264.
(Continued)

*Primary Examiner* — Dung A. Le

(57) ABSTRACT

A display substrate is provided. The display substrate includes: a plurality of pixel unit groups arranged in rows, each of the pixel unit groups including: a first-color sub-pixel unit, and a ring-shaped second-color sub-pixel unit surrounding the first-color sub-pixel unit.

16 Claims, 4 Drawing Sheets

(56) References Cited

FOREIGN PATENT DOCUMENTS

| CN | 104409474 A | 3/2015 |
|---|---|---|
| CN | 105720074 A | 6/2016 |
| CN | 106816449 A | 6/2017 |
| CN | 107452778 A | 12/2017 |

OTHER PUBLICATIONS

The Second Chinese Office Action dated Feb. 20, 2019; Appln No. 201710612242.X.

* cited by examiner

DISPLAY SUBSTRATE INCLUDING PIXEL UNIT GROUPS, DISPLAY DEVICE AND DISPLAY METHOD THEREOF, AND MASK PLATE

TECHNICAL FIELD

Embodiments of the present disclosure relate to a display substrate, a display device and a display method thereof, and a mask plate.

BACKGROUND

An Organic Light-Emitting Diode (OLED) display technology, which is considered to be an emerging application technology of next-generation flat-panel display devices, has many advantages such as self-luminescence, fast response, wide viewing angle, low cost, simple fabrication process, high resolution and high brightness.

In the OLED display technology, a high-precision metal mask plate for vacuum evaporation is a very important and critical component, and quality and precision of the component directly affect yield and quality of an OLED product. The higher the Pixels Per Inch (PPI) and the resolution of the OLED product, the smaller the size of a pixel to be fabricated. However, due to restriction of precision of the high-precision metal mask plate, it's always been difficult to improve the PPI and the resolution of the OLED product; the smaller the size of the pixel, the smaller the size of the opening of the mask plate, and the more difficult to implement the high-precision metal mask plate for evaporation.

Pentile is a pixel arrangement mode applied to the OLED product, in which the number of sub-pixels is reduced in a mode that adjacent pixel units share a sub-pixel, so as to achieve an effect of simulating a high resolution with a low resolution, which may achieve an effect of a higher visual brightness and a lower cost under a same brightness; however, its disadvantages are also self-evident: once it is necessary to display a fine content, an innate character of Pentile will be exposed completely, that is, a definition will be greatly reduced, resulting in inability to clearly display a small font.

SUMMARY

Embodiments of the present disclosure provide a display substrate, a display device and a display method thereof, and a mask plate.

An embodiment of the present disclosure provides a display substrate, comprising: a plurality of pixel unit groups arranged in rows, each of the pixel unit groups including: a first-color sub-pixel unit, and a ring-shaped second-color sub-pixel unit surrounding the first-color sub-pixel unit.

For example, each of the pixel unit groups further comprises: a ring-shaped third-color sub-pixel unit surrounding the second-color sub-pixel unit.

For example, in a plan view of the display substrate, the first-color sub-pixel unit has a block shape.

For example, the first-color sub-pixel unit has a hexagonal shape, the second-color sub-pixel unit has a hexagonal ring shape, and the third-color sub-pixel unit has a hexagonal ring shape; or the first-color sub-pixel unit has a circular shape, the second-color sub-pixel unit has a circular ring shape, and the third-color sub-pixel unit has a circular ring shape; or the first-color sub-pixel unit has a diamond shape, the second-color sub-pixel unit has a diamond ring shape, and the third-color sub-pixel unit has a diamond ring shape; or the first-color sub-pixel unit has a square shape, the second-color sub-pixel unit has a square ring shape, and the third-color sub-pixel unit has a square ring shape.

For example, the first-color sub-pixel, the second-color sub-pixel and the third-color sub-pixel are selected from a red sub-pixel, a blue sub-pixel and a green sub-pixel.

For example, the plurality of pixel unit groups comprise a first pixel unit group located in an odd row and a second pixel unit group located in an even row; in a direction from inside the pixel unit group to outside the pixel unit group, the first pixel unit group and the second pixel unit group are different in a color arrangement mode of sub-pixel units.

For example, the first pixel unit group has a blue sub-pixel unit, a green sub-pixel unit and a red sub-pixel unit respectively arranged from inside out; the second pixel unit group has a red sub-pixel unit, a blue sub-pixel unit and a green sub-pixel unit respectively arranged from inside out.

For example, the pixel unit groups of adjacent rows are staggered by a predetermined width, and the predetermined width is equal to half the width of the pixel unit group in a row direction.

For example, each sub-pixel unit comprises an organic light-emitting layer and at least one anode for driving the organic light-emitting layer to emit light.

For example, at least one of the sub-pixel units comprises a plurality of anodes independent of one another, and orthogonal projections of the plurality of anodes on the organic light-emitting layer do not overlap one another.

For example, in at least one of the pixel unit groups, the first-color sub-pixel unit comprises a first organic light-emitting layer and a first anode for driving the first organic light-emitting layer to emit light; the second-color sub-pixel unit comprises a second organic light-emitting layer and two second anodes for driving the second organic light-emitting layer to emit light, and the two second anodes are symmetrically distributed with respect to a first central line of the pixel unit group.

For example, the at least one of the pixel unit groups further comprises: a ring-shaped third-color sub-pixel unit surrounding the second-color sub-pixel unit, the third-color sub-pixel unit comprises a third organic light-emitting layer and two third anodes for driving the third organic light-emitting layer to emit light, and the two third anodes are symmetrically distributed with respect to the first central line.

For example, in at least one of the pixel unit groups, the first-color sub-pixel unit comprises a first organic light-emitting layer and a first anode for driving the first organic light-emitting layer to emit light; the second-color sub-pixel unit comprises a second organic light-emitting layer and four second anodes for driving the second organic light-emitting layer to emit light, the four second anodes are symmetrically distributed with respect to the first central line of the pixel unit group, and symmetrically distributed with respect to a second central line of the pixel unit group, and the second central line is perpendicular to the first central line.

For example, the at least one of the pixel unit groups further comprises: a ring-shaped third-color sub-pixel unit surrounding the second-color sub-pixel unit, the third-color sub-pixel unit comprises a third organic light-emitting layer and four third anodes for driving the third organic light-emitting layer to emit light, and the four third anodes are symmetrically distributed with respect to the first central line, and symmetrically distributed with respect to the second central line.

For example, in at least one of the pixel unit groups, the first-color sub-pixel unit comprises a first organic light-emitting layer and two first anodes for driving the first organic light-emitting layer to emit light, the two first anodes are symmetrically distributed with respect to a first central line of the pixel unit group; the second-color sub-pixel unit comprises a second organic light-emitting layer and four second anodes for driving the second organic light-emitting layer to emit light, the four second anodes are symmetrically distributed with respect to a first central line of the pixel unit group, and are symmetrically distributed with respect to a second central line of the pixel unit group, the second central line is perpendicular to the first central line.

For example, the at least one of the pixel unit groups further comprises: a ring-shaped third-color sub-pixel unit surrounding the second-color sub-pixel unit, the third-color sub-pixel unit comprises a third organic light-emitting layer and four third anodes for driving the third organic light-emitting layer to emit light, and the four third anodes are symmetrically distributed with respect to the first central line, and are symmetrically distributed with respect to the second central line.

Another embodiment of the present disclosure provides a display device, comprising any of the display substrate described above.

Yet another embodiment of the present disclosure provides a display method of a display device, the display device comprising any of the display substrate described above, the display method comprising: taking a first anode and a second anode closest to each other in the at least one of the pixel unit groups as one sub-pixel unit group for displaying; or taking a first anode, a second anode and a third anode closest to one another in the at least one of the pixel unit groups as one sub-pixel unit group for displaying.

Yet another embodiment of the present disclosure provides a mask plate, for fabricating any of the display substrate described above, the mask plate comprising a plurality of mask plate patterns arranged in rows, each one of the mask plate patterns including a first opening portion for evaporating an organic light-emitting layer of the first-color sub-pixel unit, a second opening portion for evaporating an organic light-emitting layer of the second-color sub-pixel unit, and a third opening portion for evaporating an organic light-emitting layer of the third-color sub-pixel unit.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
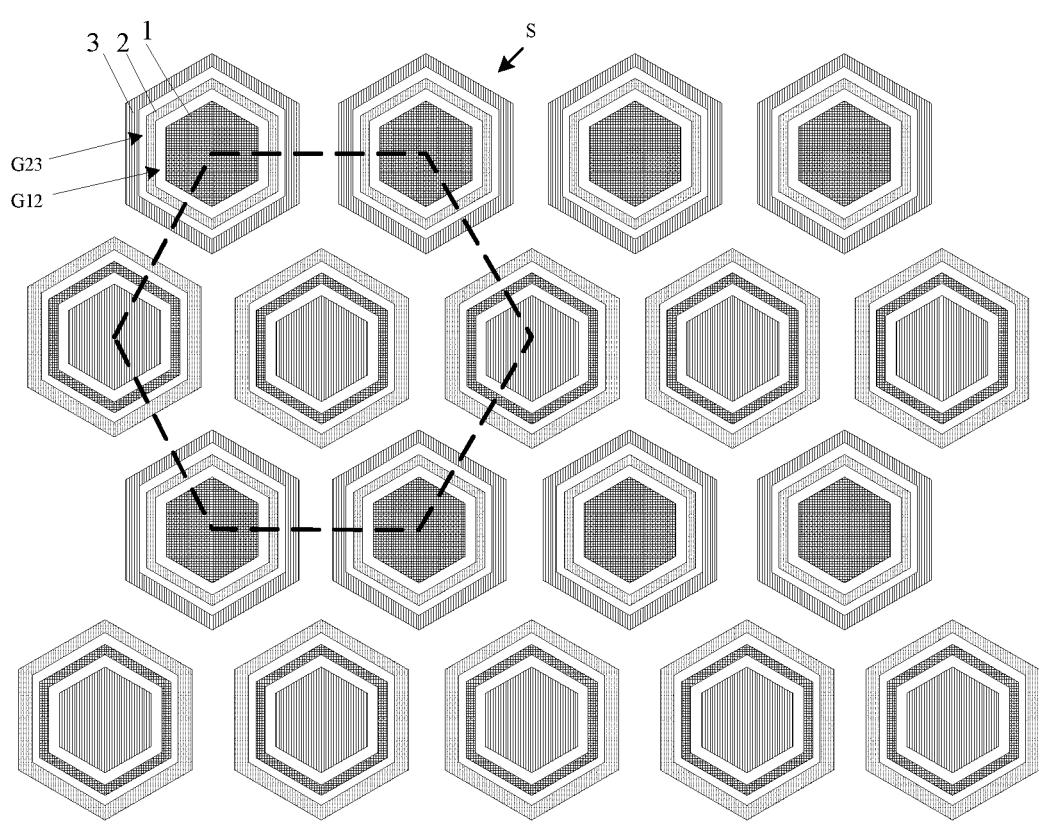
FIG. 1 is a schematic diagram of a display substrate provided by a specific embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

With respect to the problem of difficult to improve the PPI and the resolution of the OLED product due to restriction of precision of the high-precision metal mask plate, the embodiments of the present disclosure provide a display substrate, a display device and a display method thereof, and a mask plate, which may effectively improve the PPI and the resolution of the OLED product.

An embodiment of the present disclosure provides a display substrate, comprising a plurality of pixel unit groups S arranged in rows; each pixel unit group S including: a block-shaped first-color sub-pixel unit 1, a ring-shaped second-color sub-pixel unit 2 surrounding the first-color sub-pixel unit 1, and a ring-shaped third-color sub-pixel unit 3 surrounding the second-color sub-pixel unit 2.

In this embodiment, in each pixel unit group, sub-pixel units of three different colors surround one another, and a resolution of a display device can be improved by adjusting the size of the ring-shaped sub-pixel unit and the size of the central block-shaped sub-pixel in a pixel arrangement mode; when the display device displays a fine-line picture such as a small font, it may enable an observer to clearly see the fine-line picture such as the small font, which breaks through restriction of precision of a fine metal mask plate, and is able to effectively improve PPI and a resolution of an OLED product.

For example, in a plan view of the display substrate, there is a first interval G12 between the first-color sub-pixel unit and the second-color sub-pixel unit; there is a second interval G23 between the second-color sub-pixel unit and the third-color sub-pixel unit. The first-color sub-pixel unit has a hexagonal shape, the second-color sub-pixel unit has a hexagonal ring shape, and the third-color sub-pixel unit has a hexagonal ring shape; here, both the first interval G12 and the second interval G23 have a hexagonal ring shape, the first interval G12 has a substantially constant first ring width, and the first interval G12 has a substantially constant second ring width; or The first-color sub-pixel unit has a circular shape, the second-color sub-pixel unit has a circular ring shape, and the third-color sub-pixel unit has a circular ring shape; here, both the first interval G12 and the second interval G23 have a circular ring shape, the first interval G12 has a substantially constant first ring width, and the second interval G23 has a substantially constant second ring width; or The first-color sub-pixel unit has a diamond shape, the second-color sub-pixel unit has a diamond ring shape, and the third-color sub-pixel unit has a diamond ring shape; here, both the first interval G12 and the second interval G23 have a diamond ring shape, the first interval G12 has a substantially constant first ring width, and the second interval G23 has a substantially constant second ring width; or The first-color sub-pixel unit has a square shape, the second-color sub-pixel unit has a square ring shape, and the third-color sub-pixel unit has a square ring shape; here, both the first interval G12 and the second interval G23 have a square ring shape, the first interval G12 has a substantially constant first ring width, and the second interval G23 has a substantially constant second ring width.

For example, the first-color sub-pixel unit has a regular hexagon shape, the second-color sub-pixel unit has a regular hexagonal ring shape, and the third-color sub-pixel unit has a regular hexagonal ring shape; here, both the first interval G12 and the second interval G23 have a regular hexagonal ring shape, the first interval G12 has a substantially constant first ring width, and the second interval G23 has a substantially constant second ring width.

Certainly, the first-color sub-pixel unit, the second-color sub-pixel unit, and the third-color sub-pixel unit are not limited to have the above-described shapes, and may have other shapes, as long as sub-pixel units of three different colors surround one another can be implemented.

In a specific embodiment, a first-color sub-pixel unit, a second-color sub-pixel unit and a third-color sub-pixel unit are selected from a red sub-pixel unit, a blue sub-pixel unit and a green sub-pixel unit.

Red, blue, and green are the three primary colors, so, in a specific embodiment, a first-color sub-pixel unit, a second-color sub-pixel unit and a third-color sub-pixel unit can be selected from a red sub-pixel unit, a blue sub-pixel unit and a green sub-pixel unit. Of course, the first-color sub-pixel unit, the second-color sub-pixel unit, and the third-color sub-pixel unit are not limited to a red sub-pixel unit, a blue sub-pixel unit and a green sub-pixel unit, and can be sub-pixels of other colors, as long as monochromatic light emitted by the first-color sub-pixel unit, the second-color sub-pixel unit and the third-color sub-pixel unit can be mixed into white light. The first-color sub-pixel unit, the second-color sub-pixel unit and the third-color sub-pixel unit can also be selected from a yellow sub-pixel unit, a magenta sub-pixel unit and a cyan sub-pixel unit.

In the display substrate, the plurality of pixel unit groups include a first pixel unit group located in an odd row and a second pixel unit group located in an even row; in a direction from inside the pixel unit group to outside the pixel unit group, the first pixel unit group and the second pixel unit group are different in a color arrangement mode of sub-pixel groups. Thus, a better color modulation effect can be achieved, and a display quality of a display device can be improved.

In a specific embodiment, in the first pixel unit group, a blue sub-pixel unit, a green sub-pixel unit and a red sub-pixel unit are respectively arranged from inside out.

In the second pixel unit group, a red sub-pixel unit, a blue sub-pixel unit and a green sub-pixel unit are respectively arranged from inside out.

Further, the pixel unit groups of adjacent rows are staggered by a predetermined width, and the predetermined width is equal to half the width of the pixel unit group in a row direction; that is, eight pixel unit groups closest to one another in adjacent three rows can constitute a virtual hexagon (as shown by a dashed line in FIG. 1); as shown in FIG. 1, six vertices of each virtual hexagon form geometric centers of three sub-pixels arranged in hexagonal ring shape respectively. Thus, a better color modulation effect can be achieved and a display quality of a display device can be improved.

Further, each sub-pixel unit includes an organic light-emitting layer that emits light of a corresponding color and at least one anode that drives the organic light-emitting layer to emit light. The anode is fabricated by using an etching process, which is not restricted by precision of a fine metal mask plate, and a size of the anode can be made very small. A plurality of anodes can be formed corresponding to an organic light-emitting layer emitting a same color, so that each anode and a portion of organic light-emitting layer corresponding thereto form one sub-pixel, so as to divide one organic light-emitting layer to form a plurality of sub-pixels, which breaks through restriction of precision of the fine metal mask plate, and greatly improves PPI and a resolution of an OLED product.

For example, when a sub-pixel unit includes a plurality of anodes, the plurality of anodes is independent of one another, and orthogonal projections of the different anodes on the organic light-emitting layer do not overlap one another. Thus, during displaying, the anode can drive the corresponding organic light-emitting layer portion to emit light, and the corresponding organic light-emitting layer portion is a portion of the organic light-emitting layer covered by the orthogonal projection of the anode onto the organic light-emitting layer.

In a specific embodiment, in each pixel unit group, the first-color sub-pixel unit includes a first-color organic light-emitting layer and a first anode that drives the first-color organic light-emitting layer to emit light; the second-color sub-pixel unit includes a second-color organic light-emitting layer and two second anodes that drive the second-color organic light-emitting layer to emit light, the two second anodes are symmetrically distributed with respect to a first central line L1 of the pixel unit group; the third-color sub-pixel unit includes a third-color organic light-emitting layer and two third anodes that drive the third-color organic light-emitting layer to emit light, and the two third anodes are symmetrically distributed with respect to the first central line, so that a resolution of a display device to which the display substrate is applied may double the original resolution, and PPI can also be greatly improved.

In another specific embodiment, in each pixel unit group, the first-color sub-pixel unit includes a first-color organic light-emitting layer and a first anode that drives the first-color organic light-emitting layer to emit light; the second-color sub-pixel unit includes a second-color organic light-emitting layer and four second anodes that drive the second-color organic light-emitting layer to emit light, the four second anodes are symmetrically distributed with respect to the first central line L1 of the pixel unit group, and symmetrically distributed with respect to a second central line of the pixel unit group, the second central line L2 is perpendicular to the first central line L1; the third-color sub-pixel unit includes a third-color organic light-emitting layer and four third anodes that drive the third-color organic light-emitting layer to emit light, and the four third anodes are symmetrically distributed with respect to the first central line, and symmetrically distributed with respect to the second central line. Therefore, a resolution of a display device to which a display substrate is applied can be four times as the original resolution, and PPI can also be greatly improved.

In a further embodiment, in each pixel unit group, the first-color sub-pixel unit includes a first-color organic light-emitting layer and two first anodes that drive the first-color organic light-emitting layer to emit light, the two first anodes are symmetrically distributed with respect to a first central line of the pixel unit group; the second-color sub-pixel unit includes a second-color organic light-emitting layer and four second anodes that drive the second-color organic light-emitting layer to emit light, the four second anodes are symmetrically distributed with respect to the first central line of the pixel unit group, and are symmetrically distributed with respect to a second central line of the pixel unit group, the second central line is perpendicular to the first central line; the third-color sub-pixel unit includes a third-color organic light-emitting layer and four third anodes that drive the third-color organic light-emitting layer to emit light, and the four third anodes are symmetrically distributed with respect to the first central line of the pixel unit group, and are symmetrically distributed with respect to the second central line of the pixel unit group. Therefore, a resolution of a display device to which a display substrate is applied can be four times as the original resolution, and PPI can also be greatly improved.

Hereinafter, the display substrate according to the embodiment of the present disclosure will be described in detail in conjunction with the accompanying drawings:

As shown in FIG. 1, the display substrate comprises a plurality of pixel unit groups arranged in rows; pixel unit groups of adjacent rows are staggered by a predetermined width, and the predetermined width is half the width of the pixel unit group in the row direction. Each pixel unit group is formed by a blue sub-pixel unit 1, a green sub-pixel unit 2 and a red sub-pixel unit 3 surrounding one another, wherein, the sub-pixel located in the center of the pixel unit group is a regular hexagon, and the other two sub-pixels are regular hexagonal rings surrounding the central sub-pixel. As shown by the dashed line in FIG. 1, the display substrate comprises a plurality of virtual hexagons repeatedly arranged, and each of the six vertices of each virtual hexagon forms a geometric center of three sub-pixel units arranged in a hexagonal ring shape. It can be seen that, sub-pixels in pixel unit groups of two adjacent rows are arranged in different modes. In one arrangement mode of sub-pixels of a pixel unit group, a blue sub-pixel unit 1, a green sub-pixel unit 2 and a red sub-pixel unit 3 are respectively arranged from inside out; in the other arrangement mode of sub-pixels of a pixel unit group, a red sub-pixel unit 3, a blue sub-pixel unit 1 and a green sub-pixel unit 2 are respectively arranged from inside out, which, thus, ma achieve a better color modulation effect, and improve a display quality of the display device. Of course, the arrangement modes of sub-pixels of pixel unit groups of two adjacent rows are not limited to the above-described arrangement modes, a better color modulation effect can be achieved as long as sub-pixels in pixel unit groups of two adjacent rows are arranged in different modes.

In addition, during arrangement of sub-pixels, in consideration that organic light-emitting substances of different colors are different in luminous efficiency and service life, sub-pixels having different areas can be designed, and arrangement positions of sub-pixels can be adjusted. For example, a blue organic light-emitting substance has a low luminous efficiency, and blue sub-pixels can be arranged on an outer ring of a pixel unit group, to improve a light-emitting area of the blue organic light-emitting substance. An overall display effect and service life of the display device can be improved in the mode of design.

The anode is fabricated by an etching process, which is not restricted by precision of the fine metal mask plate, so a size of the anode can be made very small; a plurality of anodes can be formed corresponding to an organic light-emitting layer emitting one color, so that each anode and its corresponding organic light-emitting layer portion form one sub-pixel, so as to divide one organic light-emitting layer to form a plurality of sub-pixels, which breaks through restriction of precision of the fine metal mask plate, and greatly improves the PPI and the resolution of the OLED product.

Figure 2:
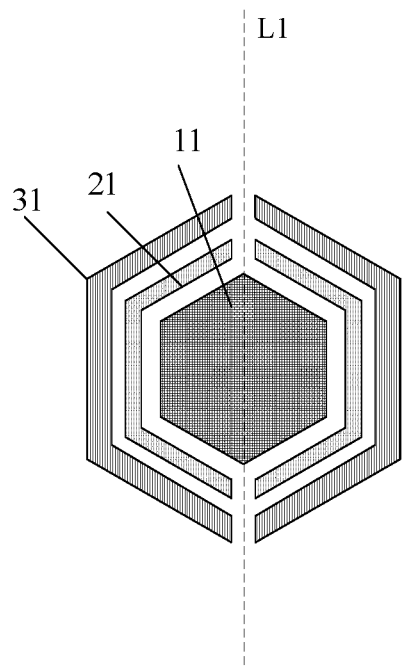
FIG. 2 is a schematic diagram of a pixel unit group provided by the specific embodiment of the present disclosure.

As shown in FIG. 2, the pixel unit group includes a blue organic light-emitting layer and an anode 11 that drives the blue organic light-emitting layer to emit light, a green organic light-emitting layer and two anodes 21 that drive the green organic light-emitting layer to emit light, and a red organic light-emitting layer and two anodes 31 that drive the red organic light-emitting layer to emit light. It can be seen that, the anode 11 and the portion of the blue organic light-emitting layer corresponding thereto constitute a blue sub-pixel; the anodes 21 and the portion of green organic light-emitting layer portion corresponding thereto constitute green sub-pixels: and the anodes 31 and the portion of red organic light-emitting layer corresponding thereto constitute red sub-pixels. The pixel unit group includes a total of one blue sub-pixel, two red sub-pixels, and two green sub-pixels. Here, the two red sub-pixels can constitute a discontinuous ring-shaped red sub-pixel unit, and the two green sub-pixels can constitute a discontinuous ring-shaped green sub-pixel unit. During displaying, the pixel unit group displays as two sub-pixel unit groups, and the blue sub-pixel is shared by the two sub-pixel unit groups. The red sub-pixel and the green sub-pixel on the left side, and the blue sub-pixel constitute one sub-pixel unit group, while the red sub-pixel and the green sub-pixel on the right side, and the blue sub-pixel constitute the other sub-pixel unit group. Since the pixel unit group can be used as two sub-pixel unit groups, the resolution of the display device can be enhanced, and the display effect of the display device can be improved.

For example, a display device with a resolution of 1280×1024 has 300 PPI, and after the design shown in FIG. 2 is adopted, the resolution is increased to 1280×2048, up to 442 PPI, with a display effect obviously improved.

Figure 3:
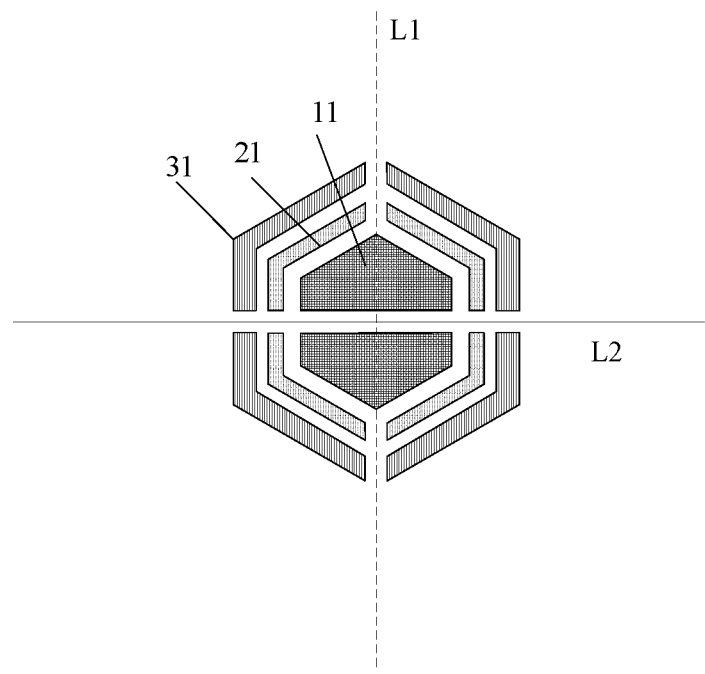
FIG. 3 is a schematic diagram of a pixel unit group provided by another specific embodiment of the present disclosure.

Further, as shown in FIG. 3, the pixel unit group includes a blue organic light-emitting layer and two anodes 11 that drive the blue organic light-emitting layer to emit light, a green organic light-emitting layer and four anodes 21 that drive the green organic light-emitting layer to emit light, a red organic light-emitting layer and four anodes 31 that drive the red organic light-emitting layer to emit light. It can be seen that, the anodes 11 and the portion of the blue organic light-emitting layer corresponding thereto constitute blue sub-pixels; the anodes 21 and the portion of the green organic light-emitting layer corresponding thereto constitute green sub-pixels, the anodes 31 and the portion of the red organic light-emitting layer corresponding thereto constitute red sub-pixels, and the pixel unit group includes a total of two blue sub-pixels, four red sub-pixels, and four green sub-pixels. Here, the two blue sub-pixels can constitute a discontinuous block-shaped blue sub-pixel unit, the four red sub-pixels can constitute a discontinuous ring-shaped red sub-pixel unit, and the four green sub-pixels can constitute a discontinuous ring-shaped green sub-pixel unit. During displaying, one pixel unit group displays as four sub-pixel unit groups, and each blue sub-pixel is shared by two sub-pixel unit groups. The red sub-pixel and the green sub-pixel at the upper left corner, and the blue sub-pixel on the upper side constitute one sub-pixel unit group; the red sub-pixel and the green sub-pixel at the upper right corner, and the blue sub-pixel on the upper side constitute another sub-pixel unit group; the red sub-pixel and the green sub-pixel at the lower left corner, and the blue sub-pixel on lower side constitute one sub-pixel unit group; the red sub-pixel and the green sub-pixel at the lower right corner and the blue sub-pixel on the lower side constitute another sub-pixel unit; since the pixel unit group can be used as four sub-pixel unit groups, the resolution of the display device can be enhanced, and the display effect of the display device can be improved.

For example, a display device with a resolution of 1280× 1024 has 300 PPI, and after the design shown in FIG. 3 is used, the resolution is increased to 2560×2048, up to 600 PPI, with a display effect obviously improved.

Figure 4:
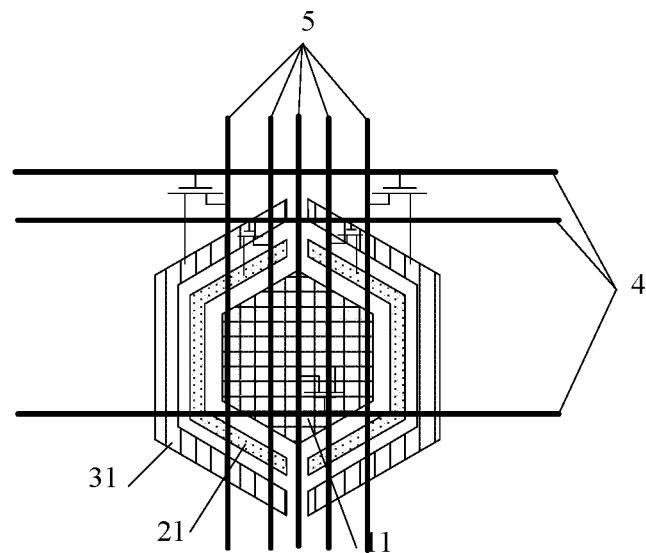
FIG. 4 is a schematic diagram of connection of a sub-pixel with a gate line and a data line in the pixel unit group provided by the embodiment of the present disclosure.

As shown in FIG. 4, each sub-pixel in the pixel unit group is controlled by an independent drive thin film transistor, a gate electrode of the drive thin film transistor is connected with a gate line 4, and a source electrode thereof is connected with a data line 5. During displaying, under line-by-line scanning control of a gate scan signal input from the gate line 4, the data line 5 inputs a data voltage. Sub-pixels of a same color in the pixel unit group can be controlled by a same gate line, and different sub-pixels in the pixel unit group are connected with different data lines.

Figure 5:
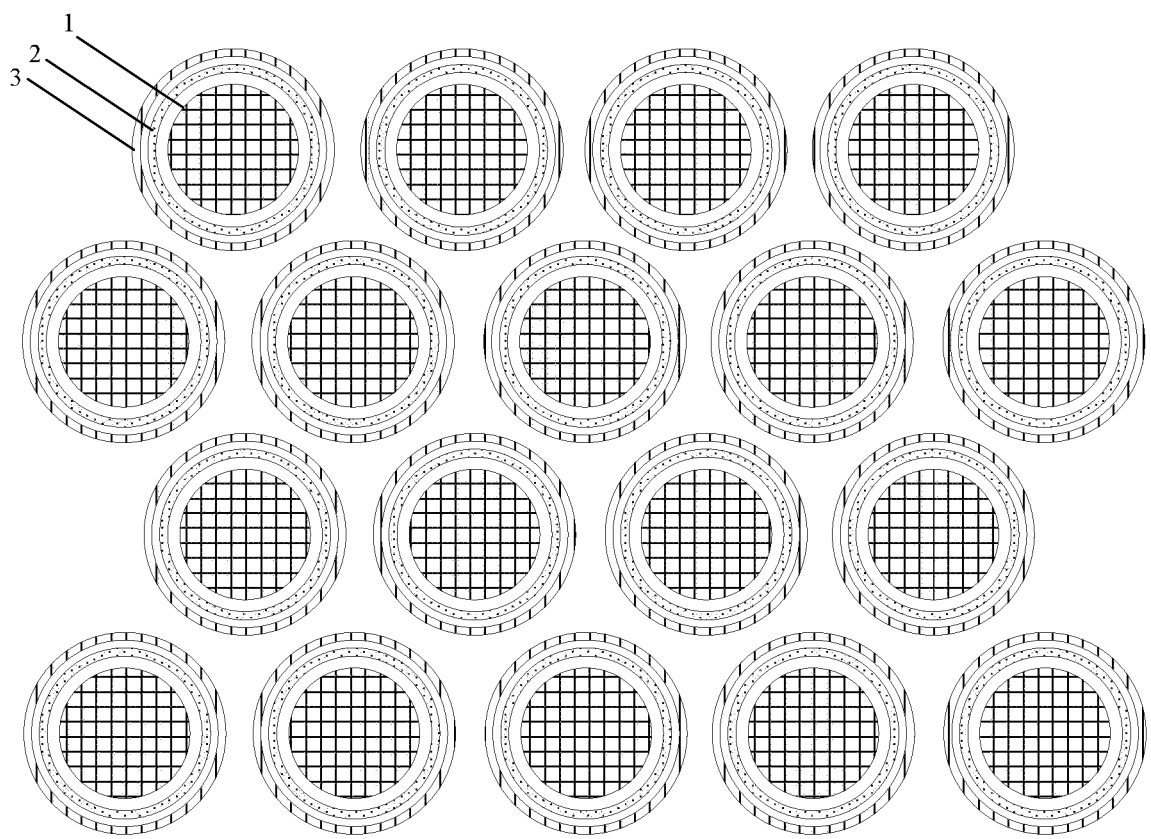
FIG. 5 is a schematic diagram of a display substrate provided by yet another specific embodiment of the present disclosure.

Further, as shown in FIG. 5, the display substrate comprises a plurality of pixel unit groups arranged in rows. Pixel unit groups of adjacent rows are staggered by a predetermined width, and the predetermined width is half the width of the pixel unit group in the row direction. Each pixel unit group is formed by a blue sub-pixel unit 1, a green sub-pixel unit 2 and a red sub-pixel unit 3 surrounding one another, wherein, the sub-pixel unit located in the center of the pixel unit group is a circle, and the other two sub-pixels are circular rings surrounding the central sub-pixel.

Figure 6:
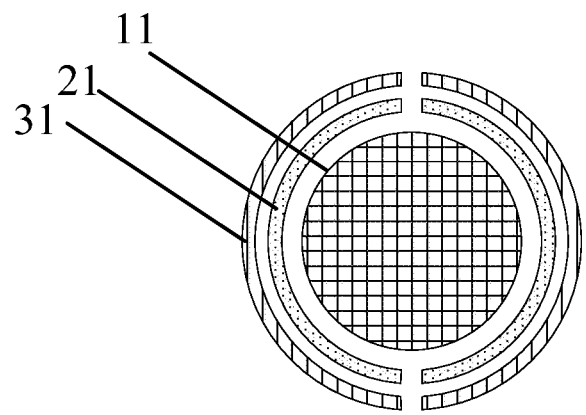
FIG. 6 is a schematic diagram of a pixel unit group provided by still another specific embodiment.

As shown in FIG. 6, the pixel unit group includes a blue organic light-emitting layer and an anode 11 that drives the blue organic light-emitting layer to emit light, a green organic light-emitting layer and two anodes 21 that drive the green organic light-emitting layer to emit light, and a red organic light-emitting layer and two anodes 31 that drive the red organic light-emitting layer to emit light. It can be seen that, the anode 11 and the portion of the blue organic light-emitting layer corresponding thereto constitute a blue sub-pixel, the anodes 21 and the portion of the green organic light-emitting layer corresponding thereto constitute green sub-pixels, and the anodes 31 and the portion of the red organic light-emitting layer corresponding thereto constitute a red sub-pixel. The pixel unit group includes a total of one blue sub-pixel, two red sub-pixels, and two green sub-pixels. Here, the two red sub-pixels can constitute a discontinuous ring-shaped red sub-pixel unit, and the two green sub-pixels can constitute a discontinuous ring-shaped green sub-pixel unit. During display, the pixel unit group displays as two sub-pixel unit groups, and the blue sub-pixel is shared by the two sub-pixel unit groups. The red sub-pixel and the green sub-pixel on the left side, and the blue sub-pixel constitute one sub-pixel unit group; and the red sub-pixel and the green sub-pixel on the right side, and the blue sub-pixel constitute the other sub-pixel unit group. Since the pixel unit group can be used as two sub-pixel unit groups, the resolution of the display device can be enhanced, and the display effect of the display device can be improved.

For example, a display device with a resolution of 1280× 1024 has 300 PPI, and after the design shown in FIG. 2 is used, the resolution is increased to 1280×2048, up to 442 PPI, with a display effect obviously improved.

Figure 7:
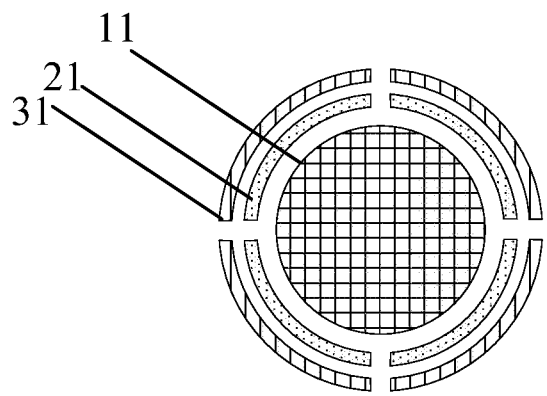
FIG. 7 is a schematic diagram of a pixel unit group provided by a further specific embodiment.

Further, as shown in FIG. 7, the pixel unit group includes a blue organic light-emitting layer and an anode 11 that drives the blue organic light-emitting layer to emit light, a green organic light-emitting layer and four anodes 21 that, drive the green organic light-emitting layer to emit light, a red organic light-emitting layer and four anodes 31 that drive the red organic light-emitting layer to emit light. It can be seen that, the anode 11 and the portion of the blue organic light-emitting layer corresponding thereto constitute a blue sub-pixel; the anodes 21 and the portion of the green organic light-emitting layer corresponding thereto constitute green sub-pixels; the anodes 31 and the portion of the red organic light-emitting layer corresponding thereto constitute red sub-pixels. The pixel unit group includes a total of one blue sub-pixel, four red sub-pixels, and four green sub-pixels. Here, the four red sub-pixels can constitute a discontinuous ring-shaped red sub-pixel unit, and the four green sub-pixels can constitute a discontinuous ring-shaped green sub-pixel unit. During displaying, the pixel unit group displays as four sub-pixel unit groups, and the blue sub-pixel is shared by the four sub-pixel unit groups: the red sub-pixel and the green sub-pixel at the upper left corner and the blue sub-pixel constitute one sub-pixel unit group; the red sub-pixel and the green sub-pixel at the upper right corner, and the blue sub-pixel constitute another sub-pixel unit group; the red sub-pixel and the green sub-pixel at the lower left corner, and the blue sub-pixel constitute one sub-pixel unit group; the red sub-pixel and the green sub-pixel at the lower right corner, and the blue sub-pixel constitute another sub-pixel unit. Since the pixel unit group can be used as four sub-pixel unit groups, the resolution of the display device can be enhanced, and the display effect of the display device can be improved.

For example, a display device with a resolution of 1280× 1024 has 300 PPI, and after the design shown in FIG. 2 is used, the resolution is increased to 2560×2048, up to 600 PPI, with a display effect obviously improved.

Although in the above-described embodiments, each pixel unit group includes sub-pixel units of three colors, and each sub-pixel unit group includes sub-pixels of three colors, yet the embodiments of the present disclosure are not limited thereto. In another embodiment, each pixel unit group may only include sub-pixel units of two colors, and each sub-pixel unit group may only include sub-pixels of three colors. In still another embodiment, each pixel unit group may include sub-pixel units of four colors, and each sub-pixel unit group may include sub-pixels of four colors.

An embodiment of the present disclosure further provides a display device, comprising the display substrate as described above. The display device can be: a television, a monitor, a digital photo frame, a mobile phone, a tablet personal computer, and any other product or component having a display function, wherein, the display device further comprises a flexible circuit board, a printed circuit board, and a back plate.

An embodiment of the present disclosure further provides a display method, applied to the display device as described above, the display method comprising:

Taking sub-pixels of different colors closest to one another in each pixel unit group as one sub-pixel unit group for displaying.

Figure 8:
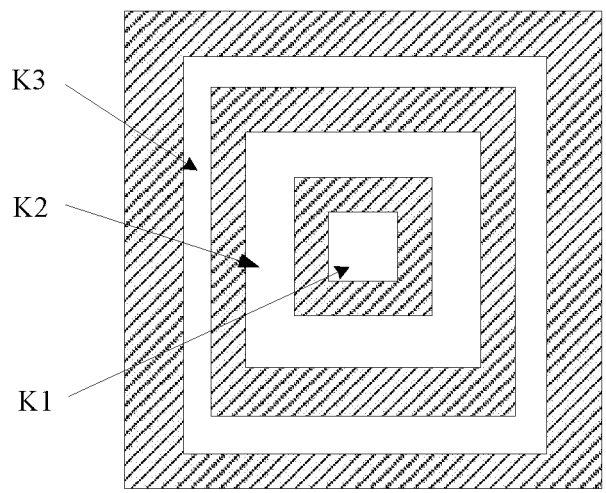
FIG. 8 is a mask plate provided by a specific embodiment of the present disclosure.

An embodiment of the present disclosure further provides a mask plate, for fabricating the display substrate as described above. the mask plate comprising a plurality of mask plate patterns arranged in rows, each mask plate pattern including a first opening portion for evaporating an organic light-emitting layer of a first-color sub-pixel group, a second opening portion for evaporating an organic light-emitting layer of a second-color sub-pixel group, and a third opening portion for evaporating an organic light-emitting layer of a third-color sub-pixel group. FIG. 8 shows a mask plate pattern, wherein, reference signs K1, K2 and K3 respectively denote the first opening portion, the second opening portion and the third opening portion.

Unless otherwise specified, the technical terms or scientific terms used in the present disclosure should be of general meaning as understood by those ordinarily skilled in the art. In the disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of the described object is changed, the relative positional relationship may also be correspondingly changed.

It can be understood that, when an element such as a layer, a film, a region or a substrate is referred to as being located "on" or "below" another element, the element can be "immediately" located "on" or "below" another element, or there can be an intermediate element.

The foregoing embodiments merely are exemplary embodiments of the present disclosure, and not intended to define the scope of the present disclosure. It should be noted that, an ordinarily skilled in the art can also make various improvements and modifications without departing from the principle of the embodiments of the present disclosure; therefore, these improvements and modifications should also be deemed as being within the scope of the embodiments of the present disclosure. The protection scope of the present disclosure is determined by the appended claims.

The present application claims priority of Chinese Patent Application No. 201710612242.X filed on Jul. 25, 2017. the disclosure of which is incorporated herein by reference in its entirety as part of the present application.

The invention claimed is:

1. A display substrate, comprising: a plurality of pixel unit groups arranged in rows, each of the pixel unit groups including: a first-color sub-pixel unit, a ring-shaped second-color sub-pixel unit surrounding the first-color sub-pixel unit, and a ring-shaped third-color sub-pixel unit surrounding the second-color sub-pixel unit, wherein, the first-color sub-pixel, the second-color sub-pixel and the third-color sub-pixel are selected from a red sub-pixel, a blue sub pixel and a green sub-pixel, the plurality of pixel unit groups comprise a first pixel unit group located in an odd row and a second pixel unit group located in an even row; in a direction from inside the pixel unit group to outside the pixel unit group, the first pixel unit group and the second pixel unit group are different in a color arrangement mode of sub-pixel units.

2. The display substrate according to claim 1, wherein, the first pixel unit group has a blue sub-pixel unit, a green sub-pixel unit and a red sub-pixel unit respectively arranged from inside out;

the second pixel unit group has a red sub-pixel unit, a blue sub-pixel unit and a green sub-pixel unit respectively arranged from inside out.

3. The display substrate according to claim 1, wherein, the pixel unit groups of adjacent rows are staggered by a width which is equal to half the width of the pixel unit group in a row direction.

4. The display substrate according to claim 1, wherein, each sub-pixel unit comprises an organic light-emitting layer and at least one anode for driving the organic light-emitting layer to emit light.

5. The display substrate according to claim 4, wherein, at least one of the sub-pixel units comprises a plurality of anodes independent of one another, and orthogonal projections of the plurality of anodes on the organic light-emitting layer do not overlap one another.

6. The display substrate according to claim 1, wherein, in at least one of the pixel unit groups, the first-color sub-pixel unit comprises a first organic light-emitting layer and a first anode for driving the first organic light-emitting layer to emit light;

the second-color sub-pixel unit comprises a second organic light-emitting layer and two second anodes for driving the second organic light-emitting layer to emit light, and the two second anodes are symmetrically distributed with respect to a first central line of the pixel unit group.

7. The display substrate according to claim 6, wherein, the third-color sub-pixel unit comprises a third organic light-emitting layer and two third anodes for driving the third organic light-emitting layer to emit light, and the two third anodes are symmetrically distributed with respect to the first central line.

8. A display substrate, comprising: a plurality of pixel unit groups arranged in rows, each of the pixel unit groups including: a first-color sub-pixel unit, and a ring shaped second-color sub-pixel unit surrounding the first-color sub-pixel unit, wherein, in at least one of the pixel unit groups, the first-color sub-pixel unit comprises a first organic light-emitting layer and a first anode for driving the first organic light-emitting layer to emit light;

the second-color sub-pixel unit comprises a second organic light-emitting layer and four second anodes for driving the second organic light-emitting layer to emit light, the four second anodes are symmetrically distributed with respect to the first central line of the pixel unit group, and symmetrically distributed with respect to a second central line of the pixel unit group, and the second central line is perpendicular to the first central line.

9. The display substrate according to claim 8, wherein, the at least one of the pixel unit groups further comprises: a ring-shaped third-color sub-pixel unit surrounding the second-color sub-pixel unit, the third-color sub-pixel unit comprises a third organic light-emitting layer and four third anodes for driving the third organic light-emitting layer to emit light, and the four third anodes are symmetrically distributed with respect to the first central line, and symmetrically distributed with respect to the second central line.

10. A display substrate, comprising: a plurality of pixel unit groups arranged in rows, each of the pixel unit wows including: a first-color sub-pixel unit, and a ring-shaped second-color sub-pixel unit surrounding the first-color sub-pixel unit, wherein, in at least one of the pixel unit groups, the first-color sub-pixel unit comprises a first organic light-emitting layer and two first anodes for driving the first organic light-emitting layer to emit light, the two first anodes are symmetrically distributed with respect to a first central line of the pixel unit group;

the second-color sub-pixel unit comprises a second organic light-emitting layer and four second anodes for driving the second organic light-emitting layer to emit light, the four second anodes are symmetrically distributed with respect to a first central line of the pixel unit group, and are symmetrically distributed with respect to a second central line of the pixel unit group, the second central line is perpendicular to the first central line.

11. The display substrate according to claim 10, wherein, the at least one of the pixel unit groups further comprises: a ring-shaped third-color sub-pixel unit surrounding the second-color sub-pixel unit, the third-color sub-pixel unit comprises a third organic light-emitting layer and four third anodes for driving the third organic light-emitting layer to emit light, and the four third anodes are symmetrically distributed with respect to the first central line, and are symmetrically distributed with respect to the second central line.

12. A display device, comprising the display substrate according to claim 1.

13. A display method of a display device, the display device comprising the display substrate according to claim 7, the display method comprising:

taking a first anode and a second anode closest to each other in the at least one of the pixel unit groups as one sub-pixel unit group for displaying; or taking a first anode, a second anode and a third anode closest to one another in the at least one of the pixel unit groups as one sub-pixel unit group for displaying.

14. A mask plate, for fabricating the display substrate according to claim 1, the mask plate comprising a plurality of mask plate patterns arranged in rows, each one of the mask plate patterns including a first opening portion for evaporating an organic light-emitting layer of the first-color sub-pixel unit, a second opening portion for evaporating an organic light-emitting layer of the second-color sub-pixel unit, and a third opening portion for evaporating an organic light-emitting layer of the third-color sub-pixel unit.

15. The display substrate according to claim 1, wherein, in a plan view of the display substrate, the first-color sub-pixel unit has a block shape.

16. The display substrate according to claim 1, wherein, die first-color sub-pixel unit has a hexagonal shape, the second-color sub-pixel unit has a hexagonal ring shape, and the third-color sub-pixel unit has a hexagonal ring shape; or the first-color sub-pixel unit has a circular shape, the second-color sub-pixel unit has a circular ring shape, and the third-color sub-pixel unit has a circular ring shape; or die first-color sub-pixel unit has a diamond shape, the second-color sub-pixel unit has a diamond ring shape, and the third-color sub-pixel unit has a diamond ring shape; or the first-color sub-pixel unit has a square shape, the second-color subpixel unit has a square ring shape, and die third-color sub-pixel unit has a square ring shape.

* * * * *